United States Patent
Huang et al.

(10) Patent No.: US 7,893,490 B2
(45) Date of Patent: Feb. 22, 2011

(54) HVNMOS STRUCTURE FOR REDUCING ON-RESISTANCE AND PREVENTING BJT TRIGGERING

(75) Inventors: Yu-Hui Huang, Taoyuan (TW); Ting-Pang Li, Hsin-Chu (TW); Fu-Hsin Chen, Jhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 494 days.

(21) Appl. No.: 11/796,832

(22) Filed: Apr. 30, 2007

(65) Prior Publication Data

US 2008/0265292 A1      Oct. 30, 2008

(51) Int. Cl.
*H01L 29/66* (2006.01)
(52) U.S. Cl. .............. 257/335; 257/E27.072; 438/170
(58) Field of Classification Search .......... 257/E27.072, 257/335; 438/170
See application file for complete search history.

(56) References Cited

U.S. PATENT DOCUMENTS

| | | | | |
|---|---|---|---|---|
| 5,227,654 A | * | 7/1993 | Momose et al. | 257/370 |
| 5,889,315 A | * | 3/1999 | Farrenkopf et al. | 257/552 |
| 6,770,951 B2 | * | 8/2004 | Huang et al. | 257/557 |

* cited by examiner

*Primary Examiner*—Thao X Le
*Assistant Examiner*—Matthew Gordon
(74) *Attorney, Agent, or Firm*—Slater & Matsil, L.L.P.

(57) ABSTRACT

A high-voltage metal-oxide-semiconductor (HVMOS) device and methods for forming the same are provided. The HVMOS device includes a substrate; a first high-voltage n-well (HVNW) region buried in the substrate; a p-type buried layer (PBL) horizontally adjoining the first HVNW region; a second HVNW region on the first HVNW region; a high-voltage p-well (HVPW) region over the PBL; an insulating region at a top surface of the second HVNW region; a gate dielectric extending from over the HVPW region to over the second HVNW region, wherein the gate dielectric has a portion over the insulating region; and a gate electrode on the gate dielectric.

19 Claims, 12 Drawing Sheets

HVNMOS STRUCTURE FOR REDUCING ON-RESISTANCE AND PREVENTING BJT TRIGGERING

TECHNICAL FIELD

This invention relates generally to semiconductor devices, and more particularly to metal-oxide-semiconductor (MOS) devices, and even more particularly to structures and manufacturing methods of high-voltage MOS devices.

BACKGROUND

High-voltage metal-oxide-semiconductor (HVMOS) devices are widely used in many electrical devices, such as CPU power supplies, power management systems, AC/DC converters, etc.

FIG. 1 illustrates conventional HVMOS 2, which includes gate oxide 10, gate electrode 12 on gate oxide 10, drain region 4 in a high-voltage n-well (HVNW) region (also referred to as drift region), and source region 6 in a high-voltage p-well (HVPW) region. Field oxide 8 spaces drain region 4 and gate electrode 12 apart so that a high drain-to-gate voltage can be applied.

Breakdown voltage and on-resistance are two of the key parameters of HVMOS devices, and increasing breakdown voltage and lowering on-resistance are among the major goals in the design of HVMOS devices. Typically, the breakdown voltage of an HVMOS device may be improved by increasing the distance between drain region 4 and gate electrode 12, hence increasing the size of the HVMOS device. Alternatively, the breakdown voltage may be increased by reducing the impurity concentration in the drift region HVNW. However, larger sizes of HVMOS devices result in greater power consumption, while reduced impurity concentrations result in increased on-resistances.

FIG. 2 illustrates another conventional structure for reducing the on-resistance. The structure is similar to the structure shown in FIG. 1, except a pre-HVNW region is formed underlying the HVNW region. Typically, in the formation of the HVMOS shown in FIG. 2, a substrate is provided, and the pre-HVNW region is doped on a surface of a substrate. An epitaxial growth is then performed to form an epitaxial layer, and the HVNW region and HVPW region are formed by implanting the epitaxial layer with desired dopants. The resistance of the pre-HVNW region parallels the resistance of the HVNW regions, and thus the on-resistance of the HVMOS device is reduced.

The HVMOS device shown in FIG. 2, however, has drawbacks. Pre-HVNW region 16 serves as the collector of the parasitic bipolar junction transistor (BJT) 14. The base resistor 18 of BJT 14 is located in the original substrate and the epitaxial region, both having low impurity concentrations. Therefore, the resistance of the parasitic base resistor 18 is high. This causes the voltage applied on the base of BJT 14 to be undesirably high, and hence BJT 14 will be easily turned on. As a result, the breakdown voltage of the MOS device is degraded.

What is needed in the art, therefore, is a HVMOS device having a high breakdown voltage and a low on-resistance, and corresponding methods for forming the same.

SUMMARY OF THE INVENTION

In accordance with one aspect of the present invention, a high-voltage metal-oxide-semiconductor (HVMOS) device and methods for forming the same are provided. The HVMOS device includes a substrate; a first high-voltage n-well (HVNW) region buried in the substrate; a p-type buried layer (PBL) horizontally adjoining the first HVNW region; a second HVNW region on the first HVNW region; a high-voltage p-well (HVPW) region over the PBL; an insulating region at a top surface of the second HVNW region; a gate dielectric extending from over the HVPW region to over the second HVNW region, wherein the gate dielectric has a portion over the insulating region; and a gate electrode on the gate dielectric.

In accordance with another aspect of the present invention, a semiconductor structure includes a semiconductor substrate; a first HVNW region extending from a top surface of the semiconductor substrate into the semiconductor substrate; a PBL extending from the top surface of the semiconductor substrate into the semiconductor substrate, wherein the PBL adjoins the first HVNW region; and an epitaxial layer on the semiconductor substrate. The epitaxial layer includes a second HVNW region on the first HVNW region, wherein the second HVNW region extends from a top surface of the epitaxial layer to a bottom surface of the epitaxial layer; and a high-voltage p-well (HVPW) region over the PBL, wherein the HVPW region extends from the top surface of the epitaxial layer into the epitaxial layer. The semiconductor structure further includes an insulating region at the top surface of the epitaxial layer and substantially in the second HVNW region; a gate dielectric extending from over the HVPW region to over the second HVNW region, wherein the gate dielectric has a portion over the insulating region; and a gate electrode on the gate dielectric.

In accordance with yet another aspect of the present invention, a semiconductor structure includes a substrate; a first high-voltage n-well (HVNW) region extending from a top surface of a substrate into the substrate; a second high-voltage n-well (HVNW) region extending from a top surface of a substrate into the substrate; a p-type buried layer (PBL) buried in the substrate and adjoining only a lower portion of the first HVNW region and a lower portion of the second HVNW region, wherein the first and the second HVNW regions are on opposite sides of the PBL; a high-voltage p-well (HVPW) region over the PBL; an insulating region at a top surface of the substrate; a gate dielectric extending from over the HVPW region to over the first HVNW region, wherein the gate dielectric has a portion over the insulating region; a gate electrode on the gate dielectric; and a source/drain region in the first HVNW and on an opposite side of the insulating region than the gate dielectric.

In accordance with yet another aspect of the present invention, a method for forming a semiconductor structure includes providing a substrate; forming a first high-voltage n-well (HVNW) region buried in the substrate; forming a p-type buried layer (PBL) horizontally adjoining the first HVNW region; forming a second HVNW region on the first HVNW region; forming a high-voltage p-well (HVPW) region over the PBL; forming an insulating region at a top surface of the second HVNW region; forming a gate dielectric extending from over the HVPW region to over the second HVNW region, wherein the gate dielectric has a portion over the insulating region; and forming a gate electrode on the gate dielectric.

In accordance with yet another aspect of the present invention, a method for forming a semiconductor structure includes providing a substrate; implanting a first high-voltage n-well (HVNW) region in the substrate; implanting a first high-voltage p-well (HVPW) horizontally adjoining the first HVNW region; epitaxially growing an epitaxial layer on the first HVNW region and the first HVPW region; implanting the epitaxial layer to form a second HVNW region substantially over the first HVNW region; and implanting the epitaxial layer to form a second HVPW region substantially over the first HVPW region; forming an insulating region at a top surface of the epitaxial layer; forming a gate dielectric extending from over the second HVPW region to over the second HVNW region, wherein the gate dielectric has a portion over the insulating region; and forming a gate electrode on the gate dielectric.

The advantageous features of the present invention include improved breakdown voltage and reduced on-resistance.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention are described with reference to FIGS. 3 through 10. Variations of the embodiments are then discussed. Throughout the various views and illustrative embodiments of the present invention, like reference numbers are used to designate like elements.

Figure 1:
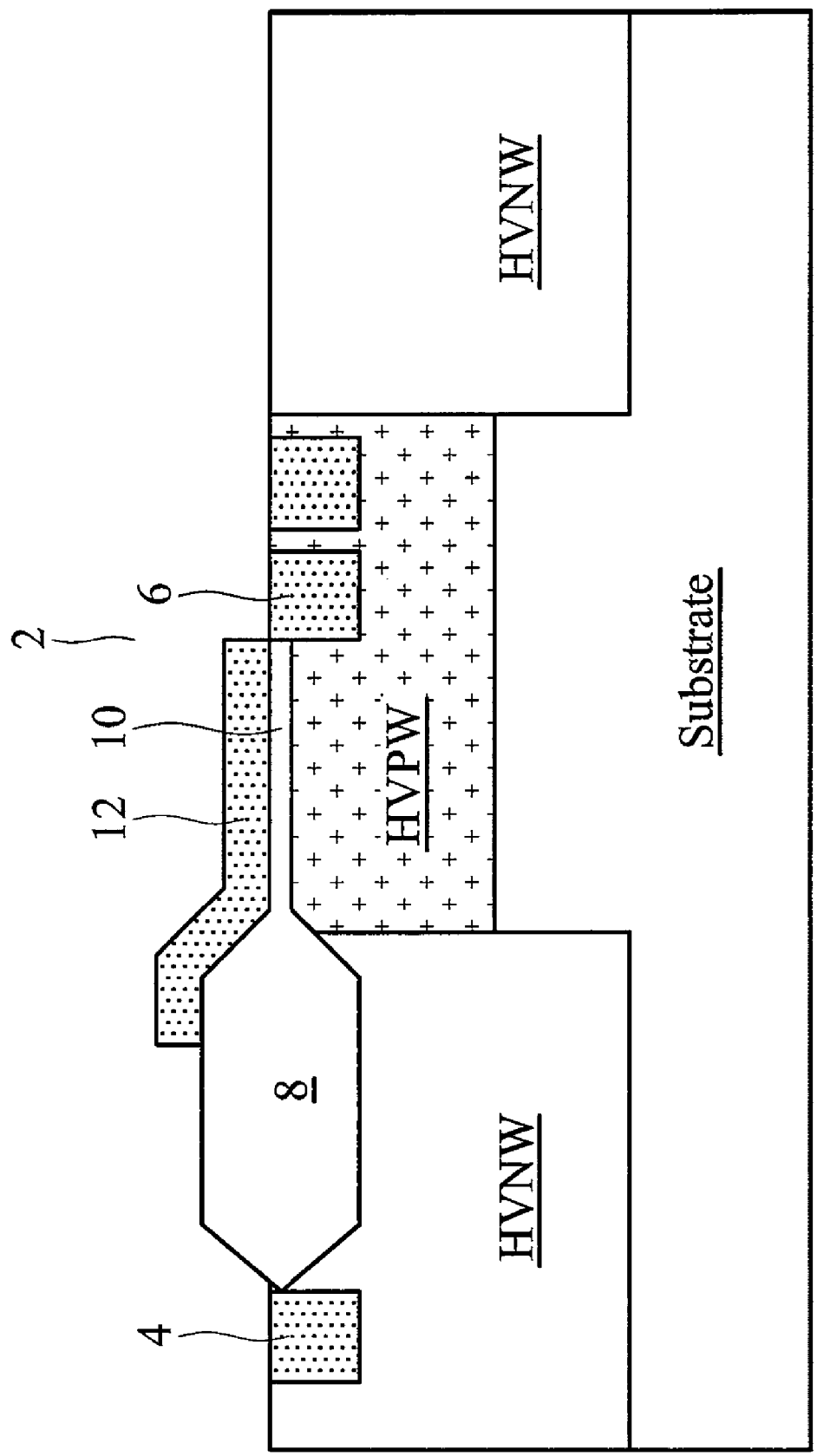
FIG. 1 illustrates a conventional high-voltage metal-oxide-semiconductor (HVMOS) device.
Figure 2:
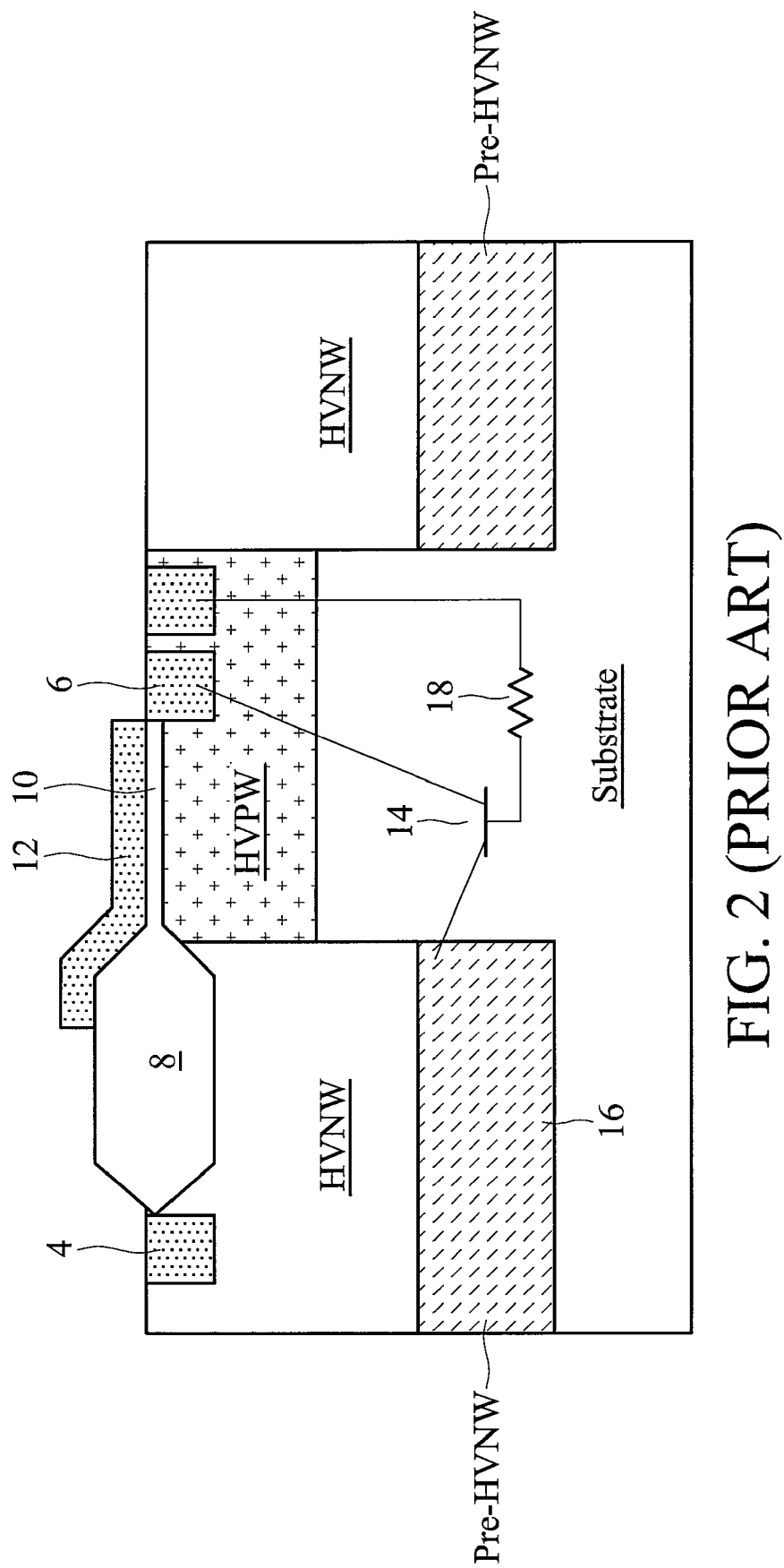
FIG. 2 illustrates a conventional HVMOS device having a pre-HVNW region.
Figure 3:
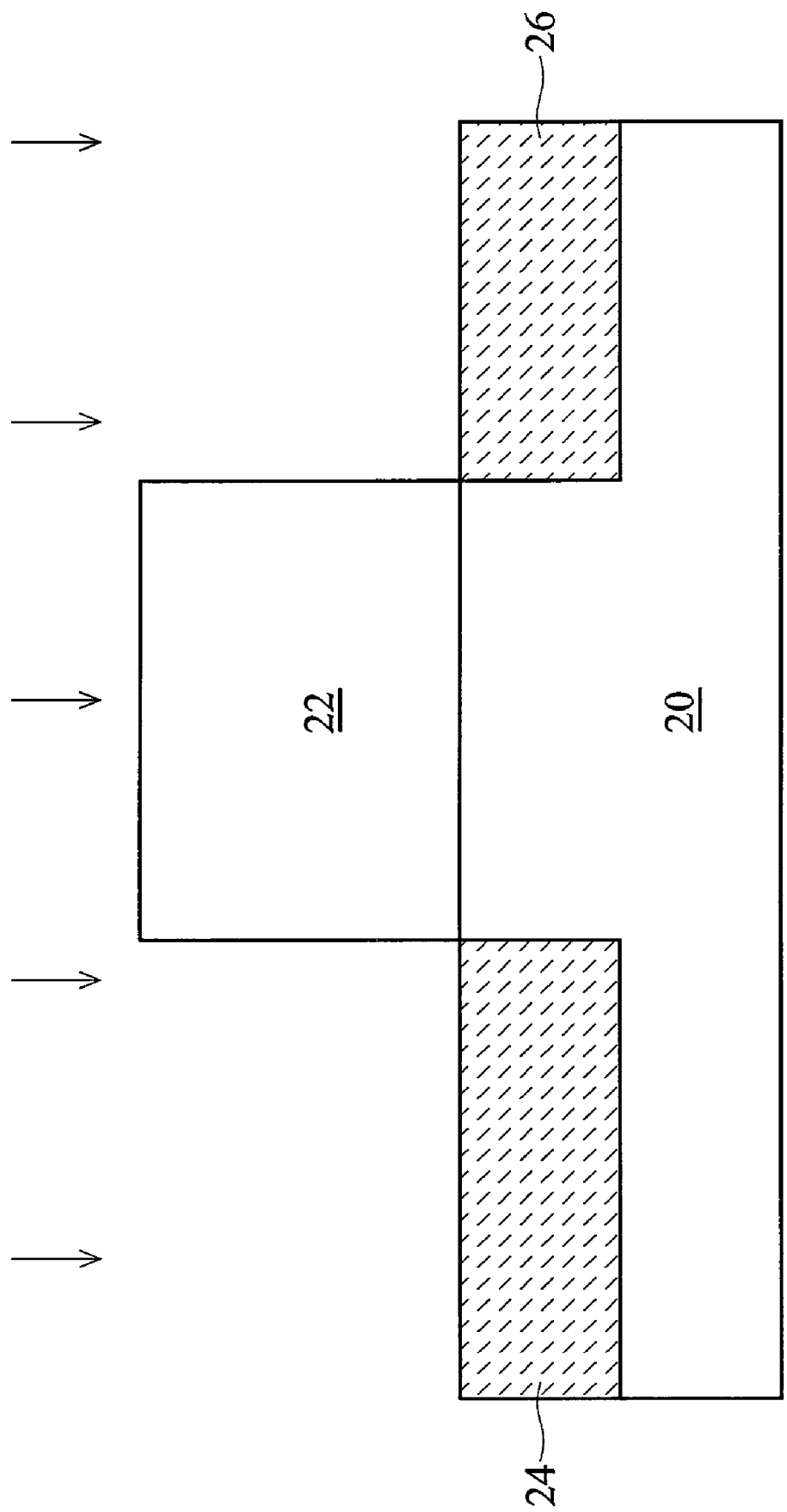
FIGS. 3 through 10 are cross-sectional views of intermediate stages in the manufacturing of an asymmetric HVMOS device.

Referring to FIG. 3, substrate 20 is provided. Substrate 20 is preferably formed of a semiconductor material such as silicon, although other semiconductor materials, such as SiGe, may be used. Substrate 20 is lightly doped with a p-type impurity. Preferably, the p-type impurity concentration is less than about $1E+15/cm^3$.

Photo resist 22 is formed on substrate 20 and is patterned using lithography techniques. An n-type impurity implantation is then performed in order to form high-voltage n-well regions (HVNW) 24 and 26. Throughout the description, HVNW regions 24 and 26 are alternatively referred to as pre-HVNW regions as they are formed prior to the formation of an epitaxial layer. Pre-HVNW region 24 is also equally referred to as drift region 24. Pre-HVNW regions 24 and 26 may be doped with phosphorus, antimony, and/or arsenic, which neutralizes the p-type impurities in substrate 20 and converts the implanted regions to n-type. After the implantation, pre-HVNW regions 24 and 26 preferably have a net n-type impurity concentration of between about $6E+14/cm^3$ and about $6E+15/cm^3$. Photo resist 22 is then removed.

Figure 4:
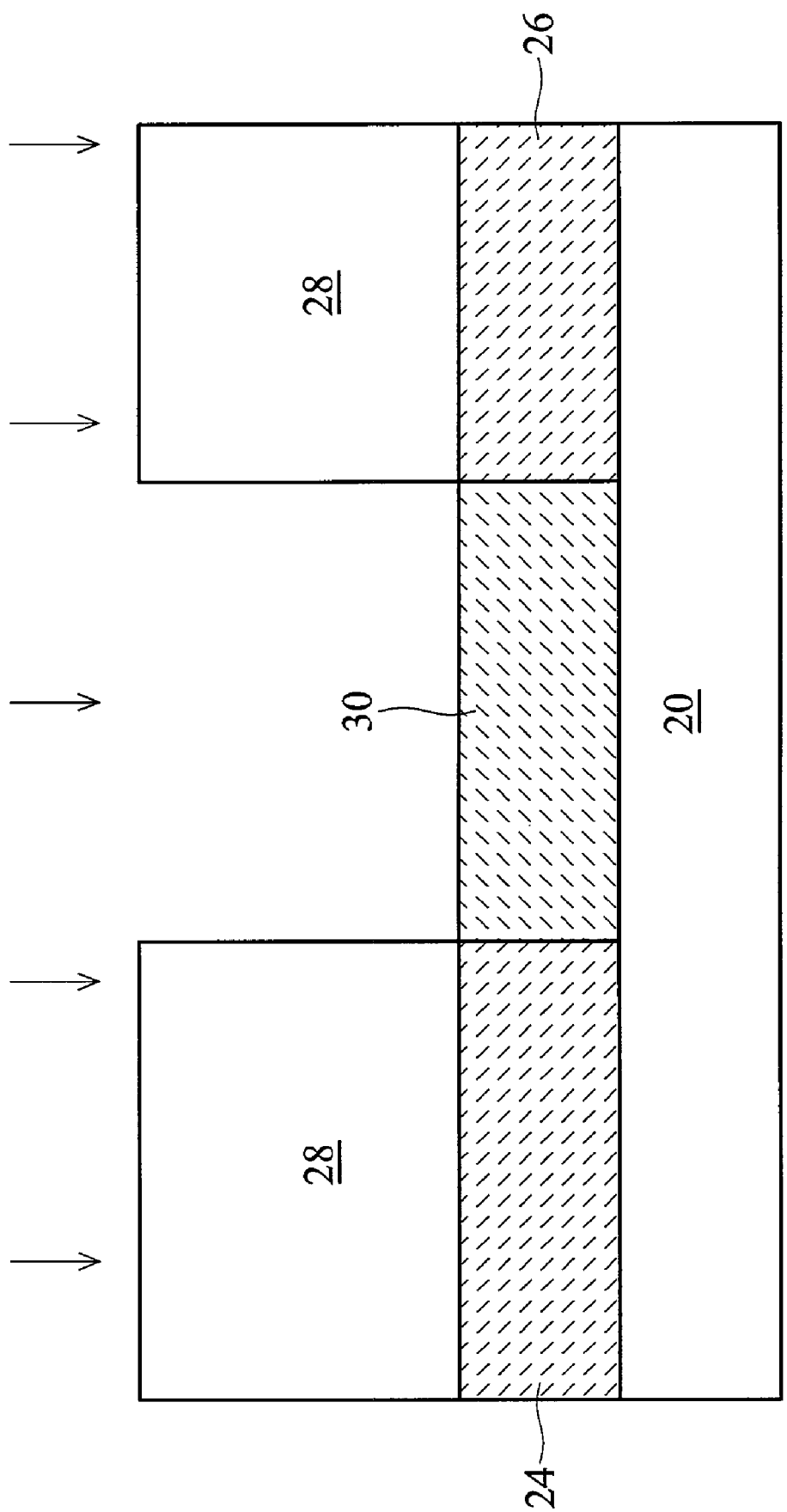

Next, as shown in FIG. 4, photo resist 28 is formed, covering pre-HVNW regions 24 and 26. A p-type impurity, preferably including boron, indium, or combinations thereof, is implanted, forming p-type buried layer (PBL) 30. Preferably, PBL 30 adjoins pre-HVNW regions 24 and 26. Although FIG. 4 illustrates PBL 30 as having a same thickness as pre-HVNW regions 24 and 26, PBL 30 may have a thickness greater than or less than the thickness of pre-HVNW regions 24 and 26. In an exemplary embodiment, the thickness of PBL 30 is between about 6000 nm and about 8000 nm. The impurity concentration of PBL 30 is preferably greater than the impurity concentration of pre-HVNW regions 24 and 26, and more preferably greater than twice the impurity concentration of pre-HVNW regions 24 and 26. In an exemplary embodiment, PBL 30 has an impurity concentration of between about $8.0E+15/cm^3$ and about $1.5E+16/cm^3$. After the implantation, photo resist 28 is removed.

Figure 5:
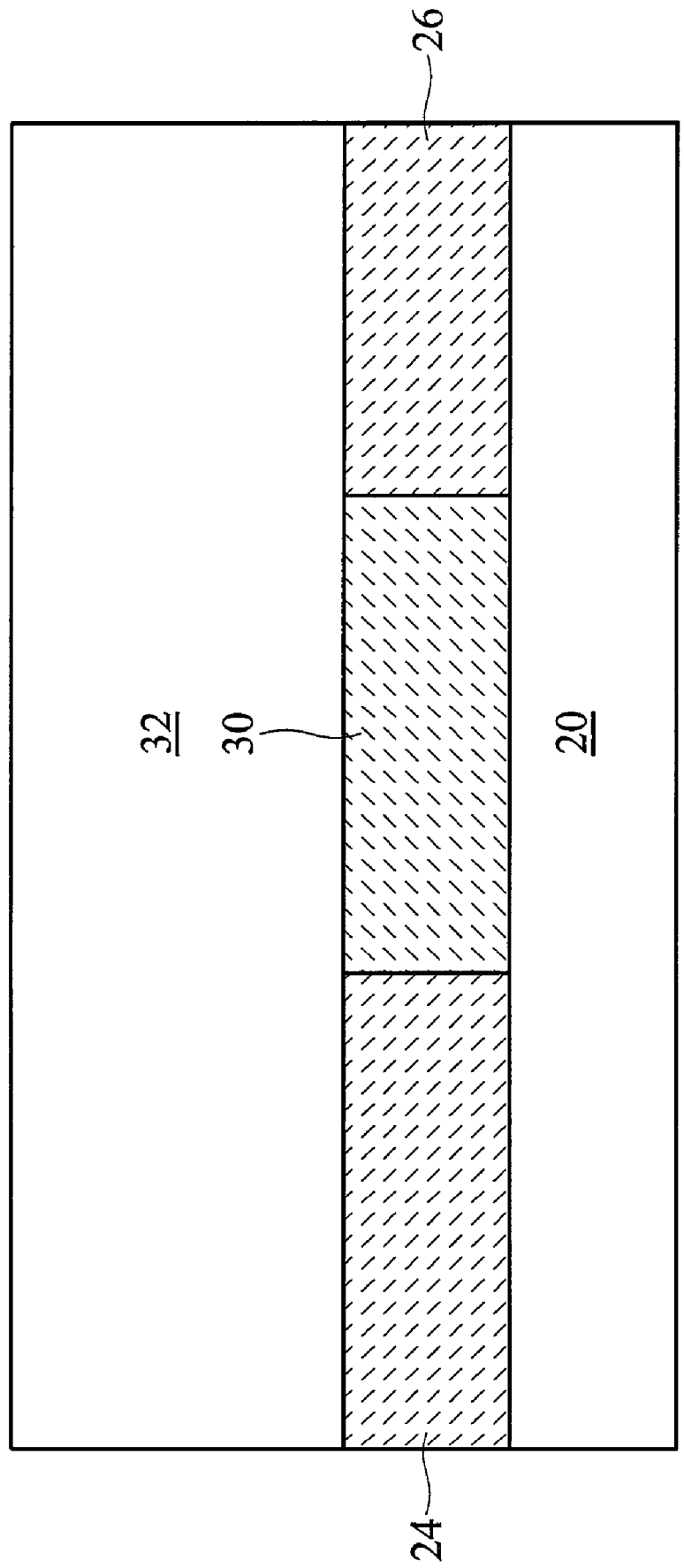

FIG. 5 illustrates the formation of epitaxial layer 32 on the top surface of substrate 20. In the preferred embodiment, epitaxial layer 32 includes silicon. With the preceding of the epitaxial growth, p-type impurities are preferably in-situ doped to a low impurity concentration. In an exemplary embodiment, epitaxial layer 32 has an impurity concentration of between about $1E+12/cm^3$ and about $1E+13 \text{ cm}^3$. In addition, the impurity concentration in epitaxial layer 32 is preferably lower than, although it can be equal to or greater than, the impurity concentration of substrate 20. A preferred thickness of epitaxial layer 32 is between about 6000 nm and about 7000 nm.

Figure 6:
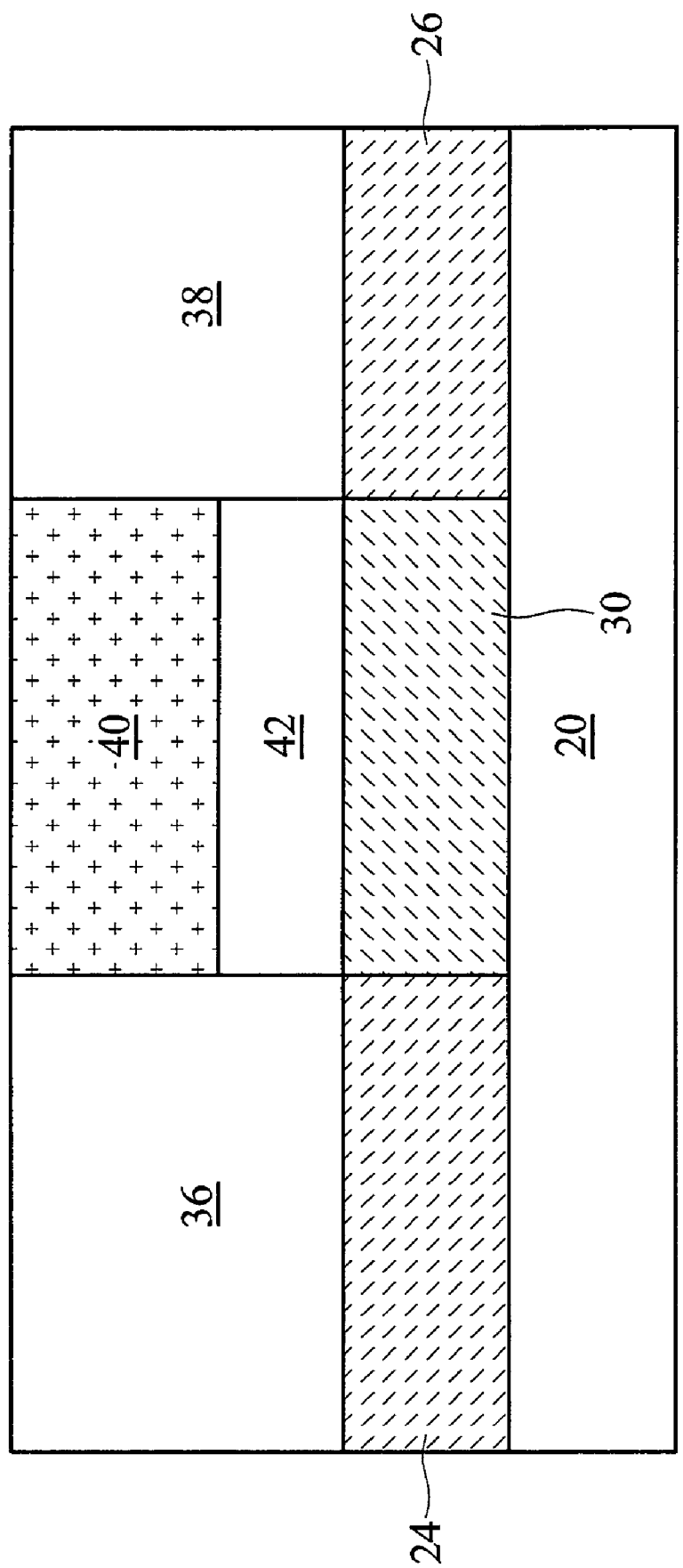

FIG. 6 illustrates the formation of HVNW regions 36 and 38 and HVPW region 40. Preferably, HVNW regions 36 and 38 are formed by implanting n-type impurities using a same mask as used for forming pre-HVNW regions 24 and 26. The thickness of HVNW regions 36 and 38 at least equals the thickness of epitaxial layer 32, so that HVNW region 36 adjoins pre-HVNW region 24, and HVNW region 38 adjoins pre-HVNW region 26. In an exemplary embodiment, HVNW regions 36 and 38 have an impurity concentration of between about $9E+15/cm^3$ and about $1.2E+16/cm^3$.

HVPW region 40 is preferably formed by implanting p-type impurities using a same mask as for forming PBL 30. In an embodiment, the thickness of HVPW region 40 is less than the thickness of epitaxial layer 32, so that a portion 42 of epitaxial region 32, which is lightly doped, remains between HVPW 40 and PBL 30. Alternatively, the thickness of HVPW regions 40 is equal to, or even greater than the thickness of epitaxial layer 32, so that HVPW region 40 adjoins PBL 30, with no remaining epitaxial region 42 therebetween. In an exemplary embodiment, HVPW region 40 has an impurity concentration of between about $1.5E+15/cm^3$ and about $1.5E+16/cm^3$. A ratio of the impurity concentration in HVPW region 40 to an impurity concentration in PBL is preferably less than about 1.0, and more preferably less than about 0.7.

Since pre-HVNW regions 24 and 26 and PBL 30 are formed by implanting the original substrate 20, the top surface of PBL 30 substantially levels with the top surfaces of pre-HVNW regions 24 and 26. If other formation methods are used, however, PBL 30 may have a top surface higher or lower than the top surfaces of pre-HVNW regions 24 and 26. For example, the top surface of PBL 30 may be higher than the top surfaces of pre-HVNW regions 24 and 26, and may even be in physical contact with HVPW region 40.

Figure 7A:
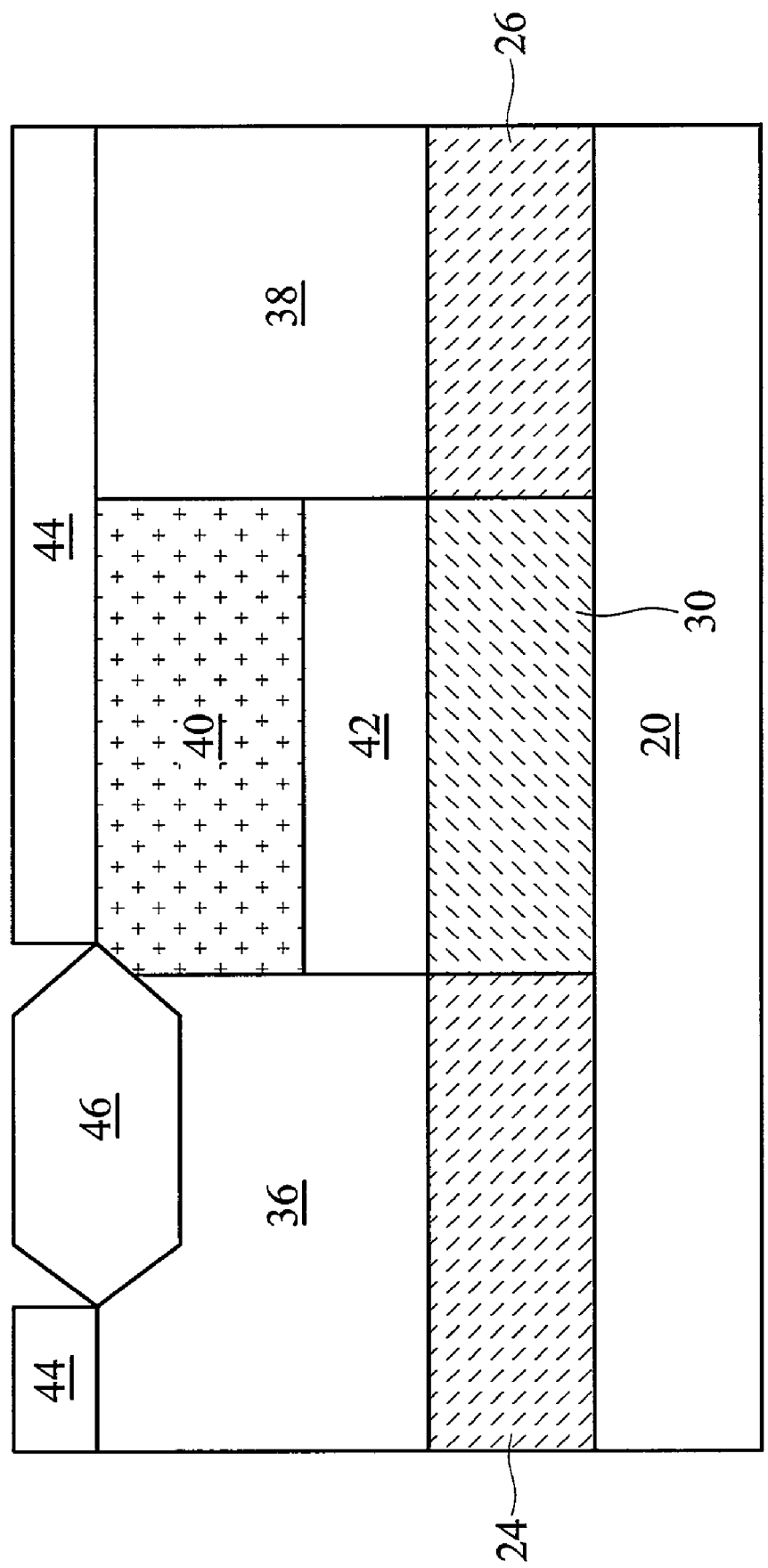
Figure 7B:
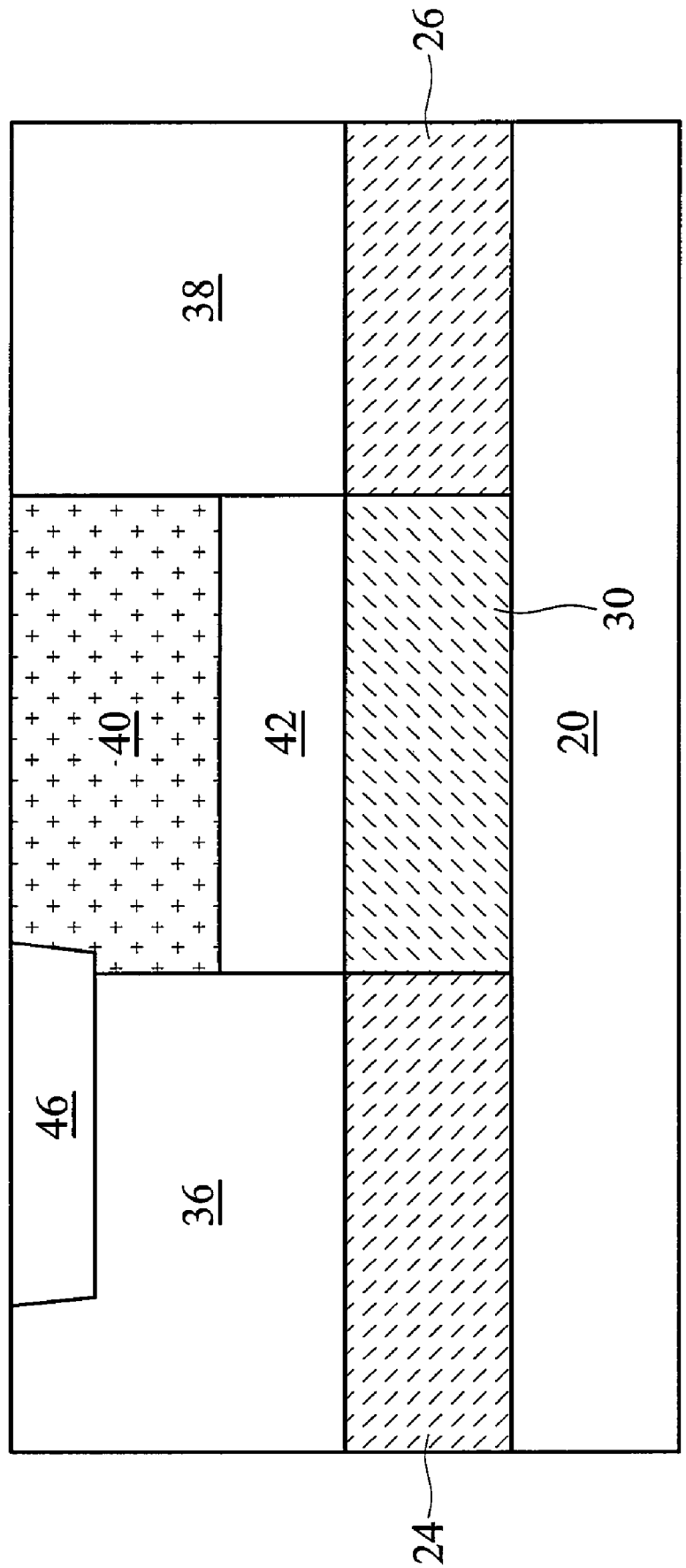

FIGS. 7A and 7B illustrate the formation of insulating region 46, which is at the surface of HVNW region 36, and may slightly extend into HVPW region 40. In an embodiment, as shown in FIG. 7A, mask layer 44, preferably formed of SiN, is blanket formed. Mask layer 44 is then patterned, forming an opening. An oxidation is then performed, and insulating region (also referred to as field oxide) 46 is formed through the opening. In other embodiments, as shown in FIG. 7B, insulating region 46 is formed by forming a recess in HVNW 36, filling the recess with a dielectric material, such as $SiO_2$ or high-density plasma (HDP) oxide, and performing a chemical mechanical polish to level the surface. The resulting insulating region 46 is a shallow trench isolation (STI) region.

Figure 8:
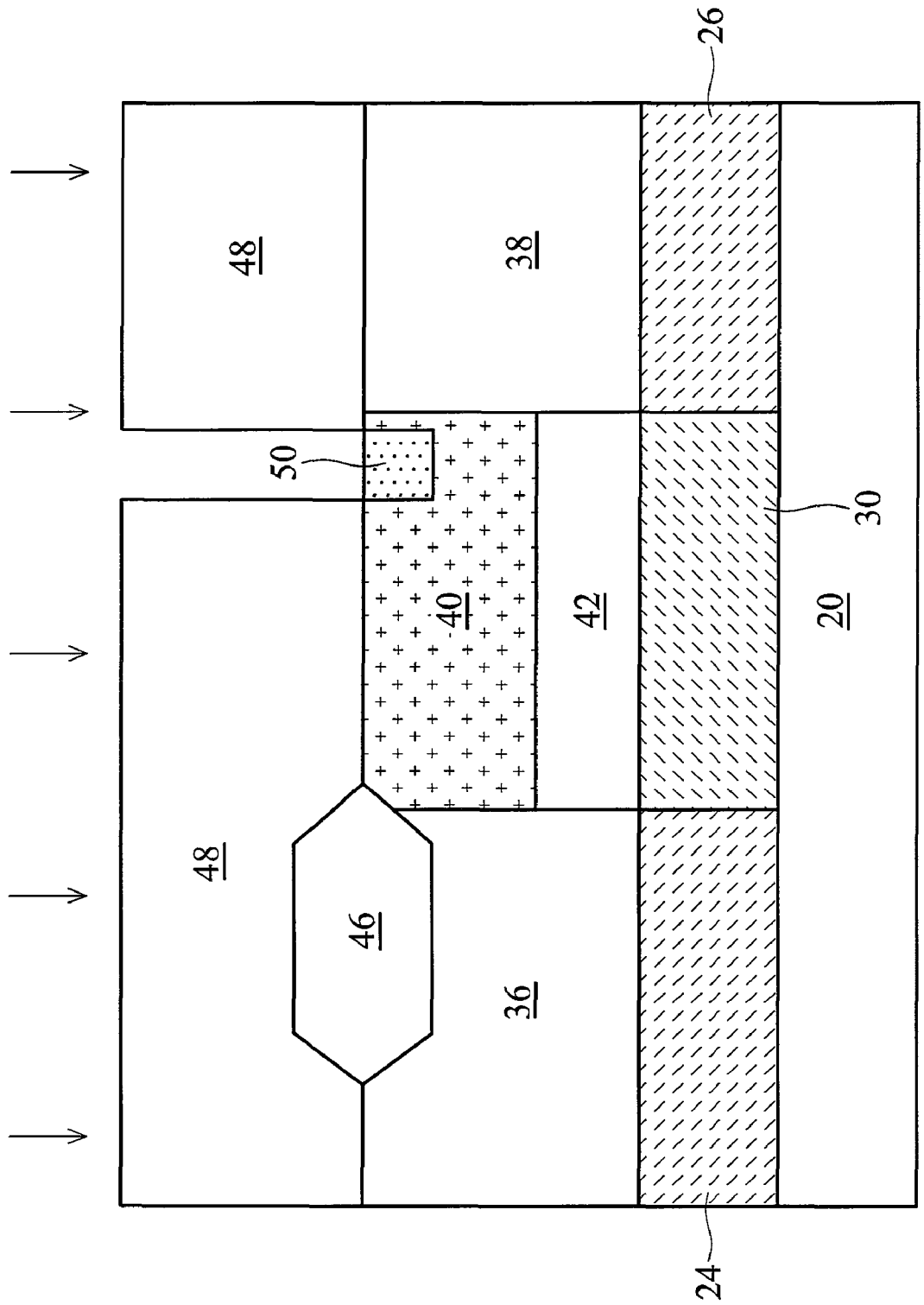

Referring to FIG. 8, photo resist 48 is applied and patterned, forming an opening therein. A p-type dopant implantation is performed, forming heavily doped (P+) contact region 50 in HVPW region 40. Preferably, P+ region 50 includes boron and/or other p-type impurities, and is heavily doped to a concentration of greater than about $10^{20}/cm^3$. In the described embodiments, heavily doped means an impurity concentration of above about $10^{20}/cm^3$. One skilled in the art will recognize, however, that heavily doped is a term of art that depends upon the specific device type, technology generation, minimum feature size, and the like. It is intended, therefore, that the term be interpreted in light of the technology being evaluated and not be limited to the described embodiments. P+ region 50 acts as a contact for p-type regions 40, 42, 30 and substrate 20. Photo resist 48 is then removed.

Figure 9:
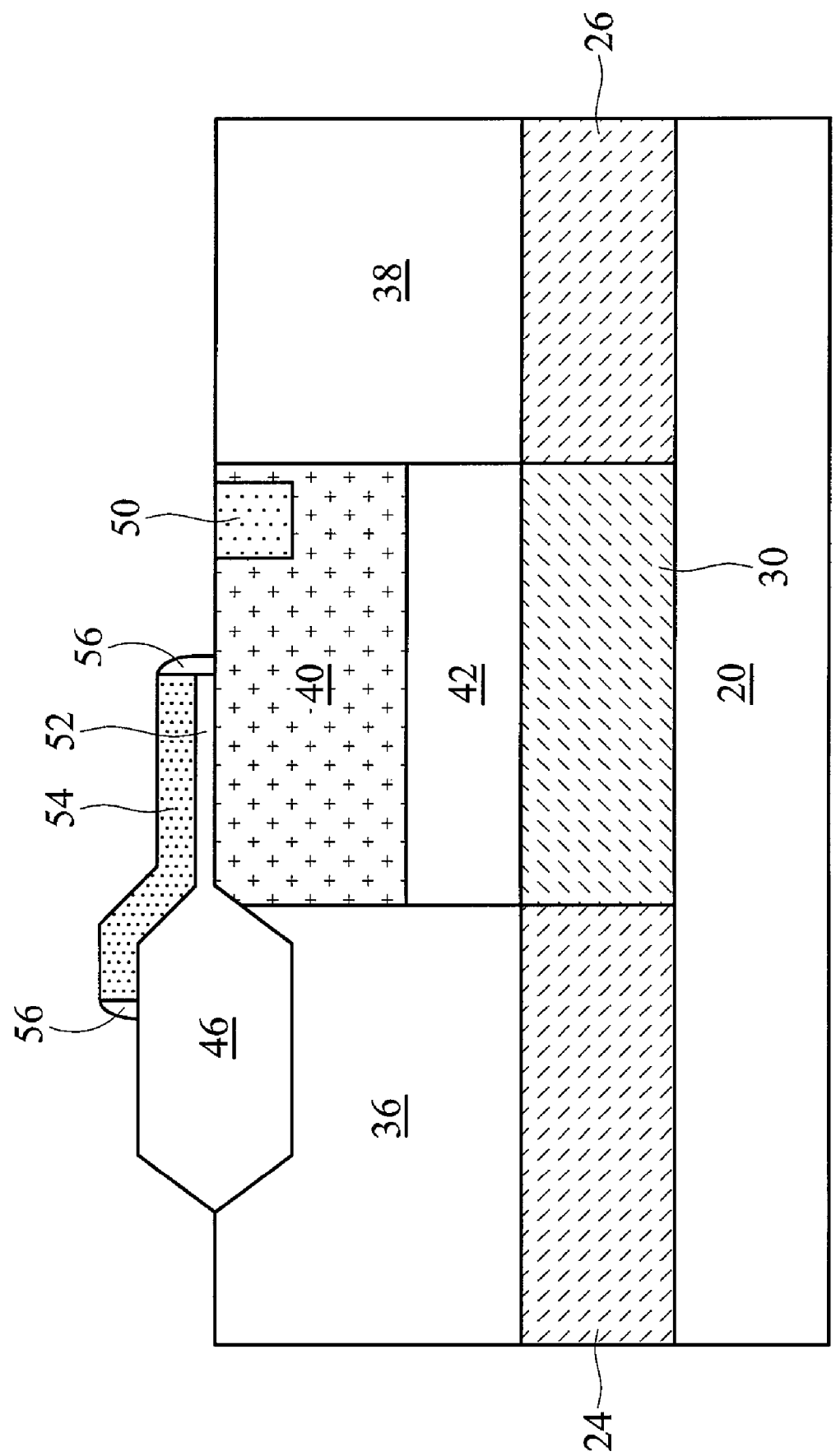

FIG. 9 illustrates the formation of gate dielectric 52, gate electrode 54 and spacers 56. As is known in the art, gate dielectric 52 preferably includes silicon oxide, although other dielectric materials such as silicon nitride, silicon carbide, silicon oxynitride, combinations thereof, and multi-layers thereof, can be used. Gate electrode 54 preferably includes doped polysilicon. Alternatively, metals, metal nitrides, metal silicides, and other conductive materials can be used. Gate spacers 56 are preferably formed by blanket forming a dielectric material, and removing undesired portions from horizontal surfaces. The details for forming gate dielectric 52, gate electrode 54 and gate spacers 56 are well known in the art, and thus are not repeated herein. Preferably, a side edge of gate electrode 54 is over insulating region 46.

Alternatively, P+ region 50 may be formed before the formation of gate dielectric 52, gate electrode 54 and gate spacers 58. One skilled in the art will realize the respective process steps.

Figure 10:
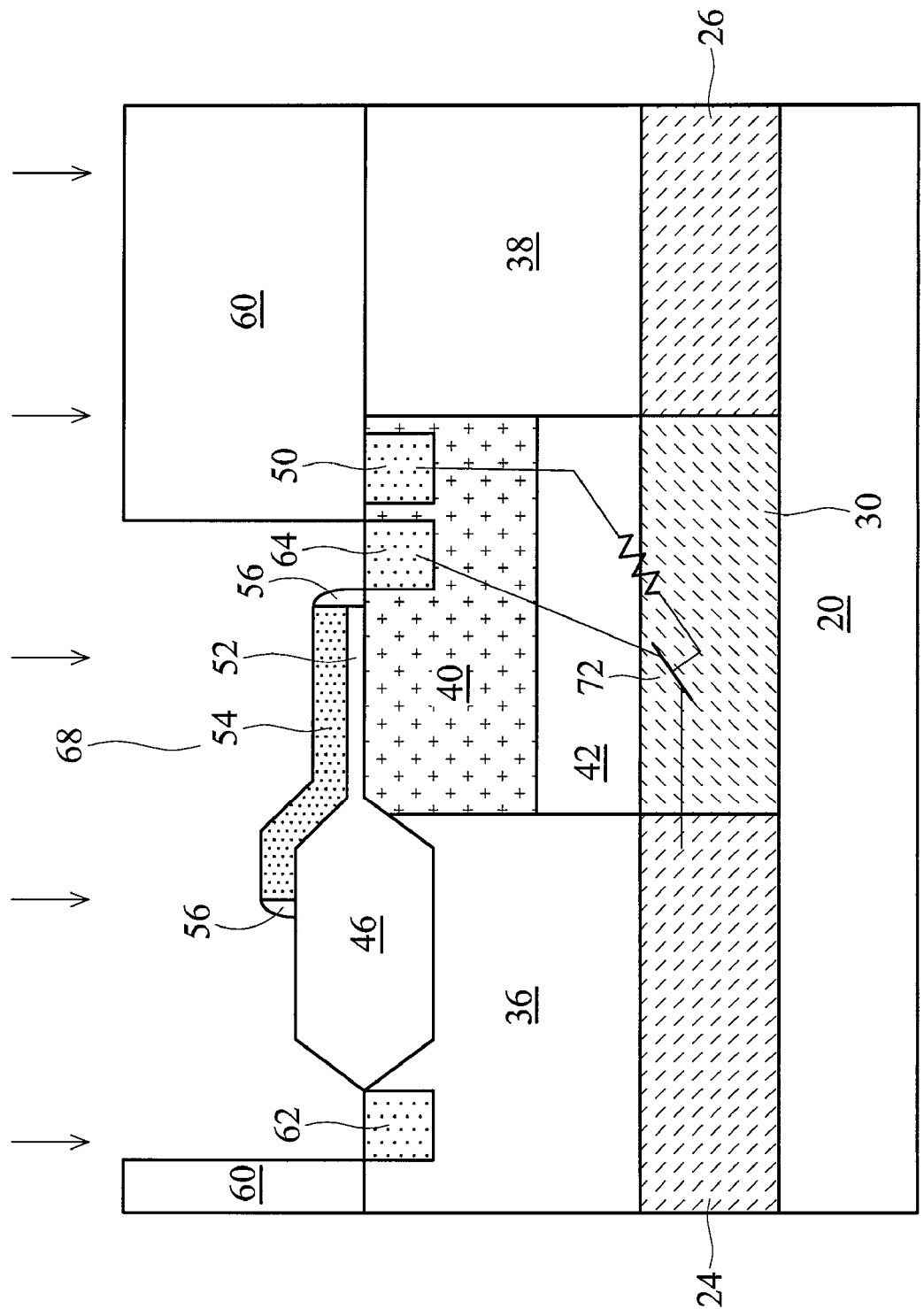

Referring to FIG. 10, photo resist 60 is formed and patterned. An n-type impurity implantation is performed, forming heavily doped n-type (N+) drain region 62 in HVNW region 36 and N+ source region 64 in HVPW region 40. HVNMOS device 68 is thus formed. The n-type impurity may include phosphorus and/or arsenic, with an impurity concentration of greater than about $10^{20}/cm^3$. After the implantation, photo resist 60 is removed. Since gate electrode 54 is spaced apart from N+ drain region 62, a high voltage can be applied.

Figure 11:
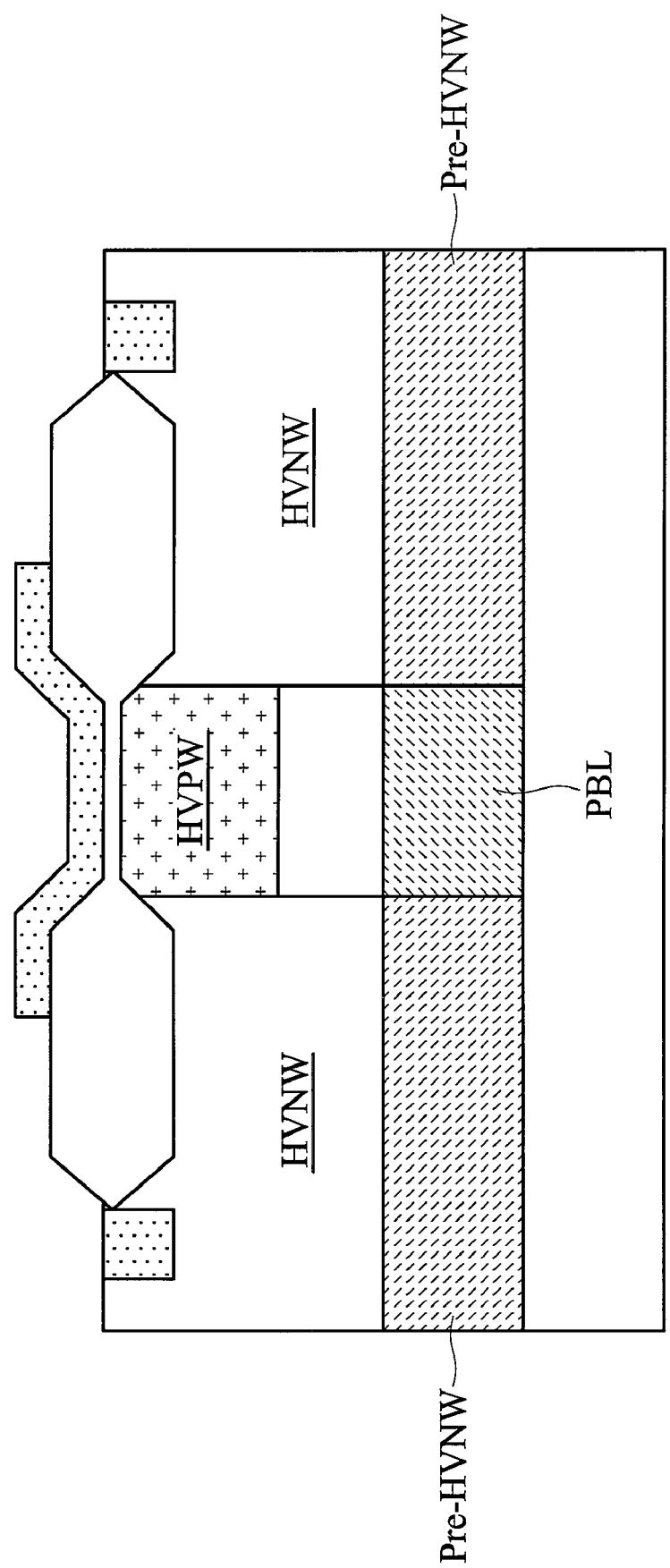
FIG. 11 illustrates a symmetric HVMOS device

The previously illustrated embodiments have asymmetric structures, wherein source and drain regions are in different types of high-voltage well regions. FIG. 11 illustrates a HVNMOS embodiment having a symmetric structure, wherein the source region and drain region of the HVNMOS device have substantially symmetric structures. Similar to the embodiment illustrated in FIG. 10, a PBL is formed under the HVPW region, while pre-HVNW regions are formed underlying HVNW regions. The process steps are essentially the same as discussed in the preceding paragraphs.

Referring back to FIG. 10, HVNMOS device 68 includes a parasitic bipolar junction transistor (BJT) 72. The collector of the parasitic BJT 72 includes HVNW region 36 and pre-HVNW region 24. The base of the parasitic BJT 72 includes substrate 20, PBL 30, HVPW 40, and possibly p-type epitaxial region 42. The emitter includes N+ source region 64. Due to the high impurity concentration in PBL 30, the base resistance of the parasitic BJT 72 is significantly reduced. BJT 72 is thus harder to be turned on. As a result, the breakdown voltage of HVMOS device 68 is increased. In the experiments for testing the performance of sample devices, a first sample device having a structure as shown in FIG. 10 is formed. A second sample device is similar to what is shown in FIG. 10, except PBL 30 is not formed. It has been found that the first sample device has an on-breakdown voltage of about 95V, about 60 percent improvement over the on-breakdown voltage of the second sample device, which is about 60V. The off-breakdown voltage is improved by about 22 percent. In addition, simulation results have shown the on-resistance ($R_{d\text{-}son}$) between drain 62 and source 64 is improved over conventional HVMOS devices having no PBL 30 and pre-HVNW regions 24 and 26.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a substrate;
   a first high-voltage n-well (HVNW) region buried in the substrate;
   a p-type buried layer (PBL) horizontally adjoining the first HVNW region;
   a second HVNW region on the first HVNW region;
   a high-voltage p-well (HVPW) region over the PBL;
   a p-type region between the PBL and the HVPW region, wherein the p-type region has an impurity concentration lower than each of the impurity concentrations of the PBL and the HVPW region;
   an insulating region at a top surface of the second HVNW region;
   a gate dielectric extending from over the HVPW region to over the second HVNW region, wherein the gate dielectric has a portion over the insulating region; and
   a gate electrode on the gate dielectric.

2. The semiconductor structure of claim 1, wherein the PBL has a higher impurity concentration than the first HVNW region.

3. The semiconductor structure of claim 2, wherein the PBL has an impurity concentration higher than two times an impurity concentration of the first HVNW region.

4. The semiconductor structure of claim 1, wherein the PBL adjoins the HVPW region.

5. The semiconductor structure of claim 4, wherein the PBL and the HVPW region have substantially different impurity concentrations.

6. The semiconductor structure of claim 1, wherein a top surface of the PBL and a top surface of the first HVNW region are substantially level.

7. The semiconductor structure of claim 1 further comprising:
   a drain region in the second HVNW region; and a source region in the HVPW region, wherein the drain and the source regions are heavily doped with an n-type impurity.

8. The semiconductor structure of claim 1, wherein the HVPW region and the PBL are under the gate electrode, and wherein the semiconductor structure further comprises:
a third HVNW region adjoining the PBL, wherein the third HVNW region is on an opposite side of the PBL than the first HVNW region; and
a fourth HVNW region on the third HVNW region;
an additional insulating region at a surface of the fourth HVNW region, wherein the gate dielectric extends over a portion of the additional insulating region;
a drain region in the second HVNW region; and
a source region in the fourth HVNW region, wherein the drain and the source regions are heavily doped with an n-type impurity.

9. The semiconductor structure of claim 1 further comprising a heavily doped p-type contact region in the HVPW region.

10. A semiconductor structure comprising:
a semiconductor substrate;
a first high-voltage n-well (HVNW) region extending from a top surface of the semiconductor substrate into the semiconductor substrate;
a p-type buried layer (PBL) extending from the top surface of the semiconductor substrate into the semiconductor substrate, wherein the PBL adjoins the first HVNW region;
an epitaxial layer on the semiconductor substrate, the epitaxial layer comprising:
a second HVNW region directly over and physically contacting the first HVNW region, wherein the second HVNW region extends from a top surface of the epitaxial layer to a bottom surface of the epitaxial layer; and
a high-voltage p-well (HVPW) region over the PBL, wherein the HVPW region extends from the top surface of the epitaxial layer into the epitaxial layer;
an insulating region at the top surface of the epitaxial layer and substantially in the second HVNW region;
a gate dielectric extending from over the HVPW region to over the second HVNW region, wherein the gate dielectric has a portion over the insulating region; and
a gate electrode on the gate dielectric.

11. The semiconductor structure of claim 10, wherein the PBL has a higher impurity concentration than the first HVNW region.

12. The semiconductor structure of claim 10, wherein the PBL has an impurity concentration of greater than about $1.5E+16/cm^3$.

13. The semiconductor structure of claim 10 further comprising a p-type region between the PBL and the HVPW region, wherein the p-type region has an impurity concentration lower than each of each impurity concentrations of the PBL and the HVPW region.

14. The semiconductor structure of claim 10, wherein the epitaxial layer has a thickness of greater than about 6000 nm.

15. A semiconductor structure comprising:
a substrate;
a first high-voltage n-well (HVNW) region extending from a top surface of a substrate into the substrate;
a second high-voltage n-well (HVNW) region extending from a top surface of a substrate into the substrate;
a p-type buried layer (PBL) buried in the substrate and horizontally adjoining a lower portion of the first HVNW region and a lower portion of the second HVNW region, wherein the PBL does not adjoin an upper portion of the first HVNW region and an upper portion of the second HVNW region, and wherein the first and the second HVNW regions are on opposite sides of the PBL;
a high-voltage p-well (HVPW) region over the PBL;
an insulating region at the top surface of the substrate;
a gate dielectric extending from over the HVPW region to over the first HVNW region, wherein the gate dielectric has a portion over the insulating region;
a gate electrode on the gate dielectric; and
a source/drain region in the first HVNW and on an opposite side of the insulating region than the gate dielectric.

16. The semiconductor structure of claim 15, wherein the PBL liras an impurity concentration higher than an impurity concentration of a portion of the substrate, and wherein the portion of the substrate is underlying the first HVNW region.

17. The semiconductor structure of claim 15, wherein the PBL has an impurity concentration greater than about twice an impurity concentration of the first and the second HVNW regions.

18. The semiconductor structure of claim 15, wherein the second HVNW region has a portion underlying the gate dielectric, and wherein the semiconductor structure further comprises a source/drain region in the second HVNW region.

19. The semiconductor structure of claim 15, wherein the gate dielectric does not extend to the second HVNW region, and wherein the semiconductor structure further comprises a source/drain region in the HVPW region.

* * * * *

UNITED STATES PATENT AND TRADEMARK OFFICE
CERTIFICATE OF CORRECTION

| | | |
|---|---|---|
| PATENT NO. | : 7,893,490 B2 | Page 1 of 1 |
| APPLICATION NO. | : 11/796832 | |
| DATED | : February 22, 2011 | |
| INVENTOR(S) | : Huang et al. | |

It is certified that error appears in the above-identified patent and that said Letters Patent is hereby corrected as shown below:

IN THE CLAIMS:
In Col. 8, line 7, claim 13, delete "of each" and insert --of the--.
In Col. 8, line 33, claim 16, delete "liras" and insert --has--.

Signed and Sealed this
Nineteenth Day of April, 2011

David J. Kappos
*Director of the United States Patent and Trademark Office*